United States Patent [19]
Hackitt et al.

[11] Patent Number: 5,489,805
[45] Date of Patent: Feb. 6, 1996

[54] SLOTTED THERMAL DISSIPATER FOR A SEMICONDUCTOR PACKAGE

[75] Inventors: Dale Hackitt, Mesa; Behrooz Mehr, Tempe, both of Ariz.

[73] Assignee: Intel Corporation, Santa Clara, Calif.

[21] Appl. No.: 457,794

[22] Filed: Jun. 1, 1995

Related U.S. Application Data

[63] Continuation of Ser. No. 174,771, Dec. 29, 1993, abandoned.

[51] Int. Cl.⁶ .................... H01L 23/34; H01L 23/495; H05K 7/20
[52] U.S. Cl. .................... 257/796; 257/713; 257/718; 257/675; 361/707; 361/723
[58] Field of Search ...................... 257/712, 713, 257/787, 796, 666, 718, 719, 675, 667; 361/679, 692, 702, 704, 707, 711, 714, 723

[56] References Cited

U.S. PATENT DOCUMENTS 5,225,710  7/1993  Westerkamp ............................ 257/796

*Primary Examiner*—Sara W. Crane
*Assistant Examiner*—Carl Whitehead, Jr.
*Attorney, Agent, or Firm*—Blakely, Sokoloff, Taylor & Zafman

[57] ABSTRACT

An integrated circuit package that contains a heat spreader which has a plurality of legs stamped from a sheet of metal material. The heat spreader also has a plurality of slots which allow plastic to flow between the bonding wires of the integrated circuit assembly during the molded injection process of the package.

4 Claims, 1 Drawing Sheet

5,489,805

SLOTTED THERMAL DISSIPATER FOR A SEMICONDUCTOR PACKAGE

This is a continuation of application Ser. No. 08/174,771 filed Dec. 29, 1993, now abandoned.

BACKGROUND OF THE INVENTION

1. Field of the Invention

The present invention relates to an electronic package which contains a heat spreader.

2. Description of Related Art

Integrated circuits are typically housed within a plastic electronic package, commonly referred to as a quad flat pack (QFP). QFP's include a lead frame which has a plurality of leads that extend from the plastic housing. The electronic package is typically mounted to a printed circuit board by soldering the leads to surface pads or plated through holes in the board.

An electronic package may contain a high powered integrated circuit such as a microprocessor. Microprocessors consume power and generate a relatively large amount of heat. The heat generated by the integrated circuit flows through the lead frame and into the printed circuit board. The lead frame has a relatively high thermal resistance because of the small cross-sectional area and long length of the leads. The high lead frame resistance creates large temperature differentials that may result in excessive junction temperatures in the integrated circuit. It is desirable to have an electronic package that will provide alternate thermal paths for the heat generated by an integrated circuit. It is also desirable to create such additional thermal paths without increasing the complexity and cost of producing the package.

SUMMARY OF THE INVENTION

The present invention is an electronic package which contains a heat spreader that reduces the thermal impedance and improves the overall thermal performance of the package. The heat spreader is shaped like a star and has a plurality of protrusions that are embedded into the housing. The engagement of the housing with the protrusions rigidly attaches the heat spreader to the package.

The package is assembled by first placing the heat spreader into a mold. A lead frame and integrated circuit die are then placed onto the head spreader. The die, heat spreader and a portion of the lead frame are enclosed with a mold cover. The mold cavity is injected with a dielectric housing material which cured and forms a hard outer housing.

The top surface of the heat spreader is separated from the mold by legs that allow dielectric material to flow under the heat spreader during the injection process. Additionally, the heat spreader has a plurality of slots adjacent to corresponding slots in the lead frame that allow dielectric material to flow therethrough and form columns within the housing.

It is therefore an object of the present invention to provide an integrated circuit package which contains a heat spreader that increases the thermal performance of the package.

It is also an object of the present invention to provide an integrated circuit package that contains a heat spreader that is simple to assemble and inexpensive to produce.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
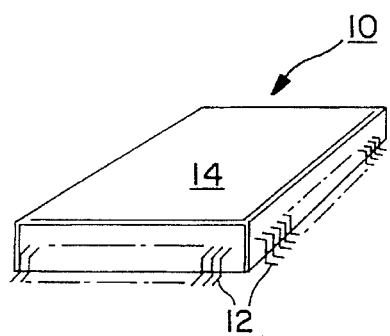
FIG. 1 is a perspective view of an electronic package of the present invention.

Referring to the drawings more particularly by reference numbers, FIG. 1 shows an electronic package 10 of the present invention. The package 10 includes a plurality of leads 12 which extend from a housing 14. The leads 12 are typically constructed from copper plated with solder and are bent into the gull wing shape shown. The housing 14 is typically constructed from a dielectric plastic material. The package 10 is mounted to a printed circuit board (not shown) by soldering the leads 12 to surface pads of the board. The package 10 is commonly referred to as quad flat pack (QFP). Although a QFP is described and shown, it is to be understood that the present invention may be utilized in other types of packages.

Figure 2:
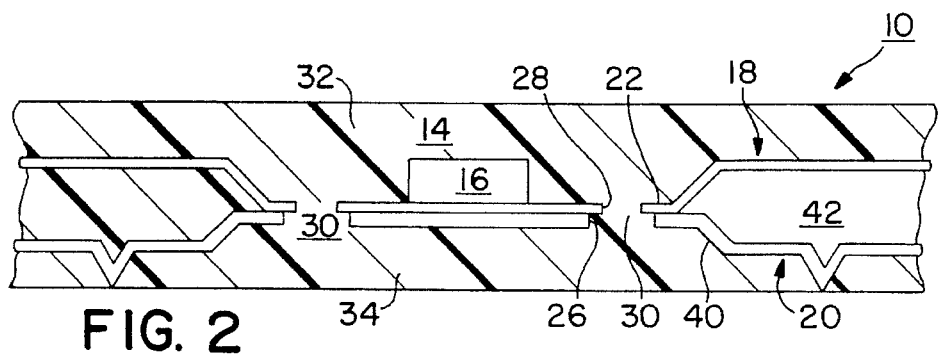
FIG. 2 is a side cross-sectional view of an electronic package of FIG. 1.

As shown in FIG. 2, the package 10 contains an integrated circuit 16 that is attached to a lead frame 18. The leads of the lead frame are bonded to outer surface pads of the die 16 and electrically couple the integrated circuit 16 to the printed circuit board on which the package 10 is mounted. The integrated circuit 16 may be a microprocessor which generates a large amount of heat.

Adjacent to the lead frame 18 is a heat spreader 20. The heat spreader 20 is preferably constructed from a thermally conductive material such as copper or an anodized aluminum. The heat spreader 20 is embedded into the housing 14 and in contact with a foot paddle portion 22 of the lead frame 18. The heat spreader 20 provides a thermal path from the die 16 to the top surface of the housing, wherein the heat can be removed by either forced or natural convection. The heat spreader 20 has a large area which provides a relatively low thermal resistance. The low thermal resistance of the heat spreader 20 improves the thermal performance of the package 10 and reduces the junction temperature of the die 16.

Figure 3:
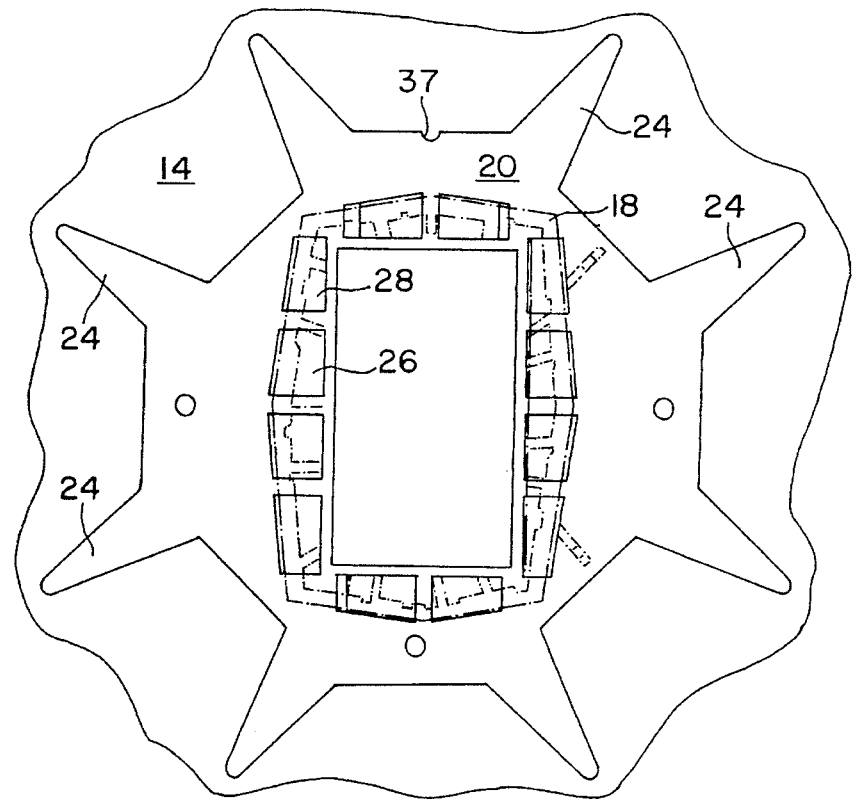
FIG. 3 is a top cross-sectional view of the package of FIG. 1.

As shown in FIG. 3, the heat spreader 20 has a plurality of protrusions 24 that are embedded into the housing 14. The protrusions 24 rigidly attach the heat spreader 20 to the housing 14 and prevent any movement or detachment of the spreader 20 from the package 10. The heat spreader 20 also has a plurality of slots 26 that are adjacent to corresponding slots 28 in the lead frame 18. Referring to FIG. 2, extending through the slots 26 and 28 are plastic housing columns 30 that extend from the top portion 32 of the package to the bottom portion 34 of the package. The columns 30 provide structural support for the leads 12 of the lead frame 18.

Figure 4:
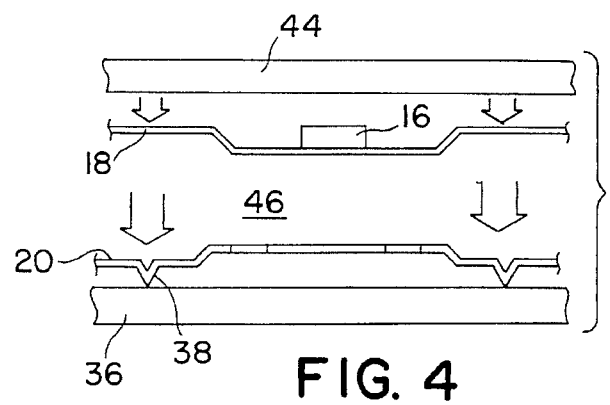
FIG. 4 is cross-sectional view of a heat spreader, lead frame and integrated circuit die within a mold.

FIG. 4 shows the heat spreader 20 placed in a mold base 36. The heat spreader 20 is properly oriented within the mold 36 by a visual reference notch 37 shown in FIG. 3. The heat spreader 20 has a plurality of legs 38 that separate the bottom of the spreader 20 from the mold 36. The legs 38 are preferably stamped into the configuration shown by pressing a tooling die into the heat spreader 20. The legs 38 are typically conical in shape to minimize the contact area between the heat spreader 20 and mold 36. The small surface area allows a greater amount of injected housing material to flow around the legs 38. Referring to FIG. 2, the heat spreader 20 has a step 40 that creates a cavity 42 between the heat spreader 20 and the lead frame 18. The cavity 42 allows housing material to flow therein and strengthen the lead frame 38.

After the heat spreader 20 is located within the mold 36, the lead frame 18 and die 16 are placed onto the spreader 20. The die 16 is typically bonded to the lead frame 18 before being placed into the mold 36. The die 16 can be bonded to the lead frame 18 using conventional wire bonding or TAB (tape automated bonding), as in known in the art. After the lead frame 18 and die 16 are placed on the heat spreader 20, the heat spreader 20, die 16 and a portion of the lead frame 18 are enclosed by a mold cover 44. The mold cover 44 and mold base 36 form a mold cavity 46. A dielectric housing material is injected into the mold cavity 46 and allowed to cure. The mold base 36 and cover 44 are removed, wherein there is formed the electronic package 10 of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A heat spreader for an electronic package which has an integrated circuit within a housing and coupled to a lead frame, comprising:

a heat spreader which has a plurality of protrusions that extend from a heat spreader body and are embedded into the housing, said heat spreader further having a plurality of conical shaped legs which extend from said body and are embedded into the housing.

2. The heat spreader as recited in claim 1, wherein said heat spreader contains a plurality of slots.

3. An electronic package, comprising:

a housing;

an integrated circuit within said housing;

a lead frame coupled to said integrated circuit;

a heat spreader which has a plurality of protrusions that extend from a heat spreader body and are embedded into said housing, said heat spreader further having a plurality of conical shaped legs which extend from said body and are embedded into said housing, said heat spreader having a plurality of slots located adjacent to an area between said integrated circuit and said lead frame.

4. The package as recited in claim 3, wherein said housing has a plurality of columns that extend through said slots in said heat spreader and said lead frame.

* * * * *

UNITED STATES PATENT AND TRADEMARK OFFICE
CERTIFICATE OF CORRECTION

PATENT NO.    :   5,489,805
DATED         :   February 6, 1996
INVENTOR(S)   :   Hackitt et al.

It is certified that error appears in the above-identified patent and that said Letters Patent is hereby corrected as shown below:

In column 3 at line 7 delete "38" and insert --18--

Signed and Sealed this

Nineteenth Day of August, 1997

Attest:

BRUCE LEHMAN

Attesting Officer

Commissioner of Patents and Trademarks